(12) United States Patent
Ohkawa

(10) Patent No.: US 7,429,507 B2
(45) Date of Patent: Sep. 30, 2008

(54) SEMICONDUCTOR DEVICE HAVING BOTH MEMORY AND LOGIC CIRCUIT AND ITS MANUFACTURE

(75) Inventor: Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 115 days.

(21) Appl. No.: 11/186,810

(22) Filed: Jul. 22, 2005

(65) Prior Publication Data

US 2005/0255644 A1 Nov. 17, 2005

Related U.S. Application Data

(62) Division of application No. 09/961,264, filed on Sep. 25, 2001, now Pat. No. 6,987,041, which is a division of application No. 09/288,302, filed on Apr. 8, 1999, now Pat. No. 6,326,657.

(30) Foreign Application Priority Data

Oct. 2, 1998 (JP) ................................ 10-281699

(51) Int. Cl.
*H01L 21/8242* (2006.01)

(52) U.S. Cl. ........................ 438/239; 438/210; 438/395; 257/E27.097; 257/E21.66

(58) Field of Classification Search ................ 438/210, 438/239, 275, 231, 232, 395; 257/E27.097, 257/E21.66
See application file for complete search history.

(56) References Cited

U.S. PATENT DOCUMENTS 5,194,924 A 3/1993 Komori et al.

(Continued)

FOREIGN PATENT DOCUMENTS

JP 5-226593 A 9/1993

(Continued)

OTHER PUBLICATIONS

Stanley Wolf, Silicon Processing for the VLSI Era, vol. 2: Process Integration, 1990 by Lattice Press, pp. 143-152.*

*Primary Examiner*—Matthew S. Smith
*Assistant Examiner*—Julio J. Maldonado
(74) *Attorney, Agent, or Firm*—Westerman, Hattori, Daniels & Adrian, LLP.

(57) ABSTRACT

A gate insulating film is formed on the principal surface of a semiconductor substrate. A silicon film is formed on the gate insulating film. Impurities are doped in the silicon film. In this case, impurities are doped into the silicon film to make a region of the silicon film in the memory cell area have a first impurity concentration and to make a region of the silicon film in the logic circuit area have a second impurity concentration lower than the first impurity concentration. The doped silicon film is patterned. In this case, the silicon film is patterned to leave word lines having the first impurity concentration and serving as gate electrodes in the memory cell area and to leave gate electrodes having the second impurity concentration in the logic circuit area. Source/drain regions of MISFET's are formed in a surface layer of the semiconductor substrate by doping impurities into regions on both sides of each word line in the memory cell area and into regions on both sides of each gate electrode in the logic circuit. The electrical characteristics of the logic circuit area can be improved while the data storage characteristics of memory cells are maintained good.

2 Claims, 12 Drawing Sheets

U.S. PATENT DOCUMENTS

| | | | |
|---|---|---|---|
| 5,237,187 A | 8/1993 | Suwanai et al. | |
| 5,444,653 A | 8/1995 | Nagasawa et al. | |
| 5,500,387 A * | 3/1996 | Tung et al. | 438/384 |
| 5,759,889 A | 6/1998 | Sakao | |
| 5,917,211 A | 6/1999 | Murata et al. | |
| 5,953,599 A * | 9/1999 | El-Diwany | 438/199 |
| 5,986,309 A | 11/1999 | Fujimoto et al. | |
| 5,986,320 A | 11/1999 | Kawano | |
| 6,133,599 A | 10/2000 | Sung et al. | |
| 6,144,079 A | 11/2000 | Shirahata et al. | |
| 6,153,903 A | 11/2000 | Clampitt | |
| 6,171,942 B1 | 1/2001 | Lee et al. | |
| 6,204,105 B1 * | 3/2001 | Jung | 438/238 |
| 6,492,690 B2 | 12/2002 | Ueno et al. | |
| 6,815,295 B1 * | 11/2004 | Ueno et al. | 438/275 |
| 2007/0126053 A1 * | 6/2007 | Lee | 257/324 |

FOREIGN PATENT DOCUMENTS

| | | |
|---|---|---|
| JP | 7-99236 A | 4/1995 |
| JP | 7-297393 A | 11/1995 |
| JP | 9-181269 A | 7/1997 |
| JP | 10-247725 A | 9/1998 |
| JP | 10-256511 A | 9/1998 |

* cited by examiner

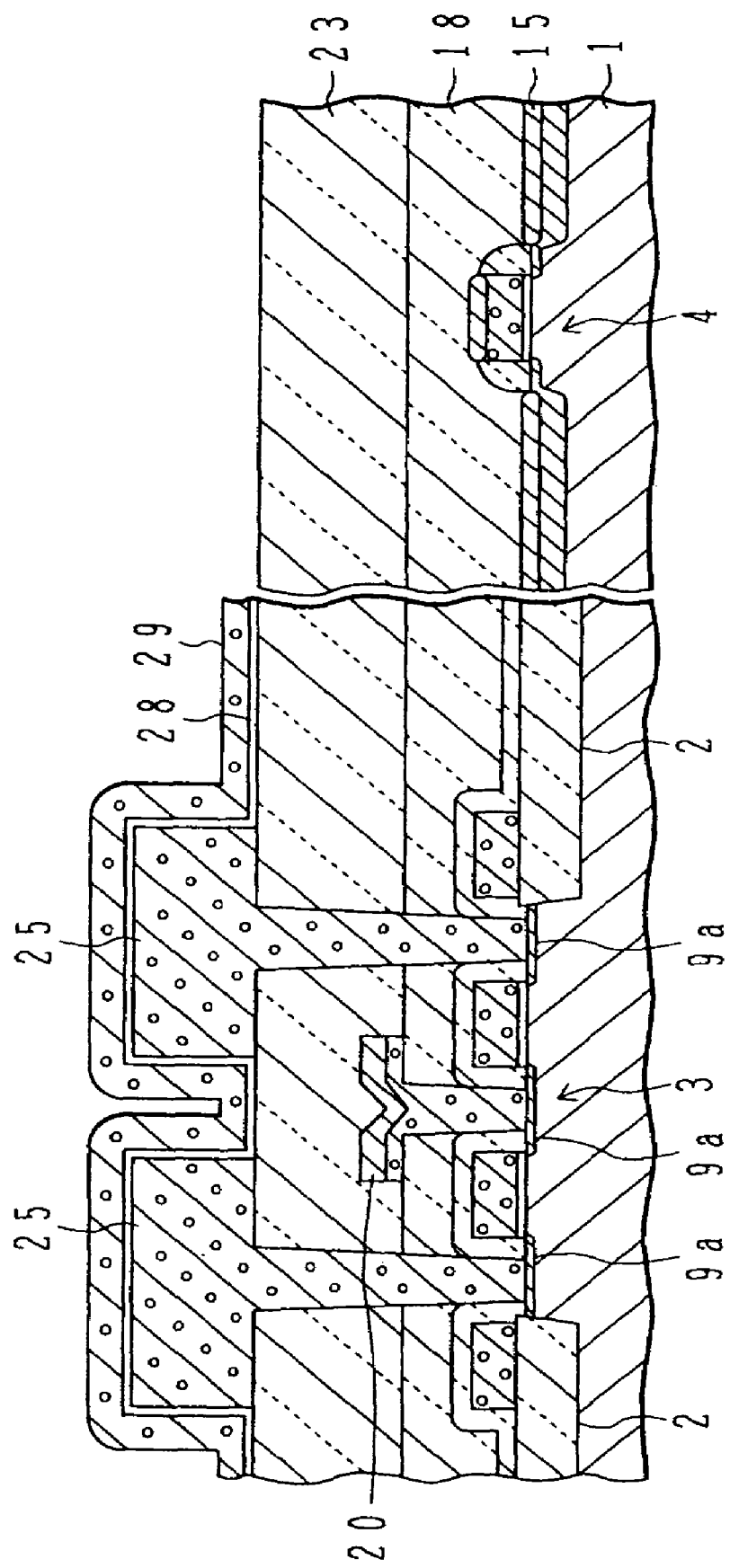

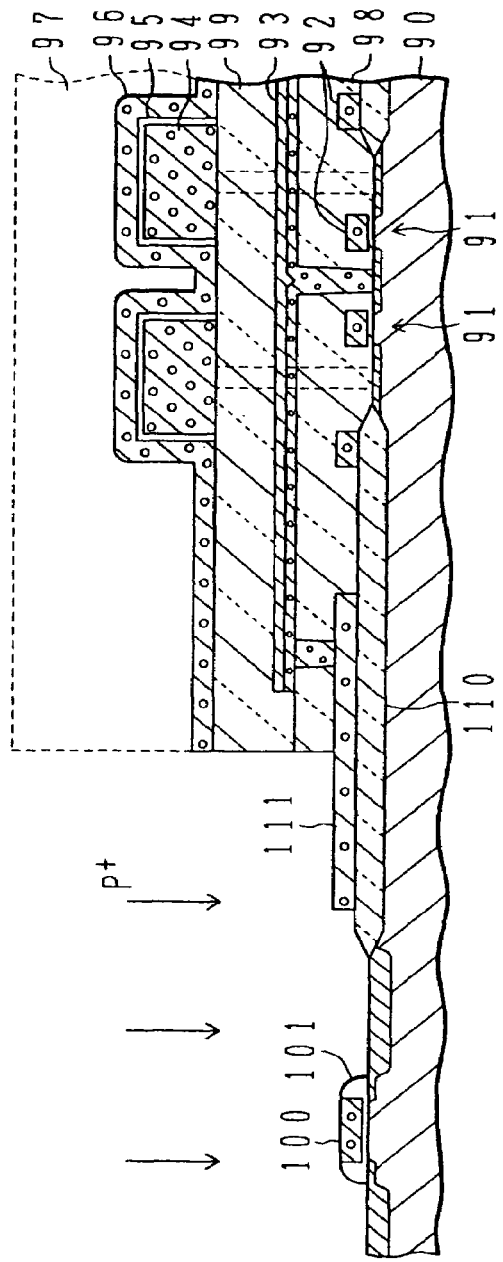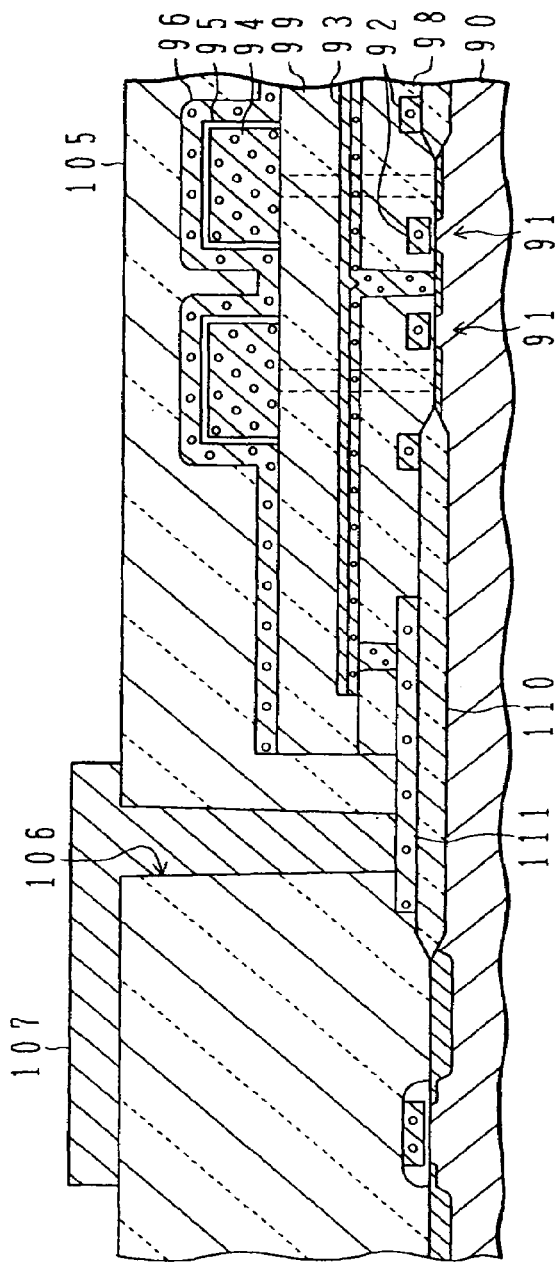

SEMICONDUCTOR DEVICE HAVING BOTH MEMORY AND LOGIC CIRCUIT AND ITS MANUFACTURE

This application is a divisional of prior application Ser. No. 09/961,264 filed Sep. 25, 2001 now U.S. Pat. No. 6,987,041, which is a divisional application of Ser. No. 09/288,302 filed Apr. 8, 1999, now U.S. Pat. No. 6,326,657 the benefit of which is claimed under 35 U.S.C. §120.

This application is based on Japanese patent application HEI 10-281699 filed on Oct. 2, 1998, the whole contents of which are incorporated herein by reference.

BACKGROUND OF THE INVENTION a) Field of the Invention

The present invention relates to a semiconductor device and its manufacture method, and more particularly to a semiconductor device having memory cells and logic circuits both formed on the same substrate, and its manufacture method.

b) Description of the Related Art

In a semiconductor device formed with both dynamic random access memories (DRAM) and logic circuits, a metal silicide film is formed on the source/drain regions and gate electrode of a MISFET in a the logic circuit area in order to improve the performance of logic circuits.

In order to improve the data storage characteristics of memory cells of a semiconductor device such as DRAM, it is desired to reduce junction leak current of source/drain regions. If a metal silicide film is formed on the source/drain regions, the junction leak current increases (refer to The 178-th Meeting, the Electro-chemical Society, pp. 218 to 220). Therefore, the metal silicide film is not formed generally during manufacture processes of DRAM.

In a semiconductor device formed with both DRAM and logic circuits, it is desired that a metal silicide film is not formed in the DRAM area but it is formed only in the logic circuit area.

In the DRAM area, the gate electrode of MISFET constituting a memory cell is generally formed integrally with a word line. In order to lower the resistance of the word line made of polysilicon or the like, it is desired to dope impurities at a high concentration. In the logic circuit area, however, a proper impurity concentration is determined from the threshold value or the like of MISFET. Therefore, the optimum impurity concentrations of the gate electrodes in the memory cell area and logic circuit area are not always coincident.

A precision of an electrostatic capacitance value of a capacitor in an analog circuit in the logic circuit area is desired to be made higher. From this reason, generally a three-layer structure of a polysilicon film/a silicon oxide film/a polysilicon fin is used. In order to reduce the voltage dependency of a capacitor, it is preferable to make the polysilicon film have a high impurity concentration. In order to suppress an increase in a manufacture cost, it is desired to suppress as much as possible an increase in the number of manufacture processes necessary for forming a polysilicon film of a high impurity concentration.

A method is known by which after only the memory cell area is formed, the logic circuit area is formed. If a bit line is disposed under the cell plate which is used as a common electrode of capacitors constituting memory cells, it is necessary that the front end of the bit line protrudes from the boarder of the cell plate in order to electrically connect the bit line and a wiring pattern in the logic circuit area. A process of removing an interlayer insulating film deposited in the logic circuit and a process of patterning a cell plate are therefore required to be executed separately when memory cells are formed.

SUMMARY OF THE INVENTION

It is an object of the present invention to provide a semiconductor device and its manufacture method capable of improving the electric characteristics of a logic circuit area while the data storage characteristics of memory cells are maintained good.

It is another object of the present invention to provide a semiconductor device formed with both DRAM and memory circuits and its manufacture method, capable of forming capacitors in the logic circuit area while an increase in the number of manufacture processes is suppressed.

It is a further object of the invention to provide a semiconductor device and its manufacture method capable of electrically connecting a bit line in the memory cell area to a wiring pattern in the logic circuit area while an increase in the number of manufacture processes is suppressed when only the memory cell area is formed before the logic circuit area is formed.

According to one aspect of the present invention, there is provided a method of manufacturing a semiconductor device comprising the steps of: preparing a semiconductor substrate having a memory cell area and a logic circuit area defined on a principal surface of the semiconductor substrate; forming a gate insulating film on the principal surface of the semiconductor substrate; forming a silicon film on the gate insulating film; doping impurities into the silicon film to make a region of the silicon film in the memory cell area have a first impurity concentration and to make a region of the silicon film in the logic circuit area have a second impurity concentration lower than the first impurity concentration; patterning the silicon film to leave word lines having the first impurity concentration and serving as gate electrodes in the memory cell area and to leave gate electrodes having the second impurity concentration in the logic circuit area; and forming source/drain regions of MISFET's in a surface layer of the semiconductor substrate by doping impurities into regions on both sides of each word line in the memory cell area and into regions on both sides of each gate electrode in the logic circuit.

Since the impurity concentration of word lines in the memory cell area is relatively high, the resistance of the word line can be lowered. Since the impurity concentration of gate electrodes of MISFET's in the logic circuit area is relatively low, the electrical characteristics of MISFET's can be improved According to another aspect of the present invention, there is provided a semiconductor device comprising a semiconductor substrate having a memory cell area and a logic circuit area defined on a principal surface of the semiconductor substrate; a plurality of memory cells disposed in the memory cell area of the semiconductor substrate, each memory cell including a first MISFET and a capacitor, and a gate electrode of each first MISFET having a first impurity concentration; and a plurality of second MISFET's disposed in the logic circuit area of the semiconductor substrate, each second MISFET having a conductivity type same as a conductivity type of the first MISFET and a gate electrode of each second MISFET having a second impurity concentration lower than the first impurity concentration.

Since the impurity concentration of gate electrodes of MISFET's in the memory cell area is relatively high, the resistance of the word line serving also as the gate electrode can be lowered. Since the impurity concentration of gate electrodes of MISFET's in the logic circuit area is relatively low, the electrical characteristics of MISFET's can be improved.

According to another aspect of the present invention, there is provided a method of manufacturing a semiconductor device comprising the steps of: preparing a semiconductor substrate having a memory cell area and a logic circuit area defined on a principal surface of the semiconductor substrate; forming an element separation structure made of insulating material in a partial area of the principal surface of the semiconductor substrate to define active regions; forming first gate insulating films in areas of the principal surface of the semiconductor substrate where the element separation structure is not formed; forming a first conductive film covering the element separation structure and the first gate insulating films; removing the first conductive film in the memory cell area; forming a capacitor dielectric film on a surface of the first conductive film; forming a second conductive film on the capacitor dielectric film and on the semiconductor substrate; patterning the second conductive film to leave an upper electrode over the element separation structure and to lave a plurality of word lines serving as gate electrodes in the memory cell area; and patterning the capacitor dielectric film and the first conductive film to leave a lower electrode made of the first conductive film, in which the lower electrode is left in a shape inclusive of the upper electrode as viewed along a direction normal to the semiconductor substrate, a gate electrode made of the first conductive film is left over the active region in the logic circuit area, and the capacitor dielectric film is left between the upper and lower electrodes.

The upper electrode of capacitors and the word lines are formed at the same time, and the lower electrodes and the gate electrodes in the logic circuit area are formed at the same time. It is therefore possible to form capacitors while an increase in the number of manufacture processes is suppressed.

According to another aspect of the present invention, there is provided a semiconductor device comprising: a semiconductor substrate having a memory cell area and a logic circuit area defined on a principal surface of the semiconductor substrate, and element separation structures formed on surfaces of the logic circuit area and the memory cell area; a plurality of memory cells disposed on the semiconductor substrate in the memory cell area, each memory cell including a first MISFET and a capacitor and a gage electrode of the first MISFET having a first structure; a plurality of second MISFET's disposed on the semiconductor surface in the logic circuit area, each second MISFET having a same conductivity type as a conductivity type of the first MISFET and a gate of the second MISFET having a second structure; and a capacitor disposed on the element separation structure in the logic circuit area, the capacitor having a lower electrode, a capacitor dielectric film, and an upper electrode stacked in this order, wherein the upper electrode has the first structure and the lower electrode has the second structure.

According to another aspect of the present invention, there is provided a semiconductor device comprising: MISFIT's formed on a surface of a semiconductor substrate, each MISFET including source/drain regions and a gate electrode disposed above a channel region between the source/drain regions; a cover insulating film made of insulating material and covering an upper and side surfaces of the gate electrode; a conductive pad disposed covering a corresponding upper surface of the source/drain regions and corresponding side surfaces of the cover insulating films; an interlayer insulating film disposed over the semiconductor substrate and covering the pad and the MISFET's; a contact hole formed in the interlayer insulating film at a position included by the pad as viewed along a direction normal to the semiconductor substrate; and a capacitor formed on the interlayer insulating film, one electrode of the capacitor being connected via the contact hole to the pad.

When the contact hole is formed, the pad is exposed and the underlying source/drain regions are not exposed. Since the source/drain regions are not exposed to the etching atmosphere of etching the interlayer insulating film, damages to the source/drain regions can be avoided.

According to another aspect of the present invention, there is provided a method of manufacturing a semiconductor substrate comprising the steps of: preparing a semiconductor substrate having a memory cell area and a logic circuit area defined on a principal surface of the semiconductor substrate; forming a DRAM circuit on the semiconductor substrate in the memory cell area, wherein the DRAM circuit includes a plurality of memory cells and bit lines, each memory cell has a pair of MISFET and capacitor, one electrode of the capacitor is connected to one region of source/drain regions of a corresponding MISFET, the bit line interconnects the other regions of source/drain regions of MISFET's of some memory cells, the bit line extends near to a boarder line between the memory cell area and the logic circuit area, the other opposing electrode of the capacitor is disposed on a layer higher than the bit line and connected to a plurality of capacitors, a first insulating film electrically insulates the bit lines and MISFET's, a second insulating film electrically insulates the bit lines and capacitors, and the opposing electrode and first and second insulating films are also disposed in the logic circuit area; covering a surface of the opposing electrode in the memory cell area with a resist pattern, wherein a boarder of the resist pattern is positioned apart from a front end of the bit lines toward the logic circuit area; isotropically etching the opposing electrode to remove the opposing electrode in the logic circuit area, by using the resist pattern as a mask, wherein the opposing electrode in the logic circuit area is also side-etched until a border of the opposing electrode retracts from the front end of the bit line; etching and removing the first and second interlayer insulating films in the logic circuit area by using the resist pattern as a mask; covering a whole surface of the semiconductor substrate with a third interlayer insulating film; forming a contact hole in the third and second interlayer insulating films, the contact hole being formed at a position away from the boarder of the opposing electrode toward the logic circuit area and exposing a partial upper surface of the bit line; and forming a wiring on the third insulating film, the wiring being connected via the contact hole to the bit line and extending in the logic circuit area.

Since the opposing electrode is side-etched through isotropic etching, the boarder of the opposing electrode can be retracted from the boarder line between the logic circuit area and memory cell area. It is therefore easy to connect the wiring in the logic circuit area to the bit line.

According to another aspect of the present invention, there is provided a semiconductor device comprising a semiconductor substrate having a memory cell area and a logic circuit area defined on a principal surface of the semiconductor substrate; an element separation structure formed on the semiconductor substrate in a boarder area between the memory cell area and the logic circuit area; an interconnect wiring disposed on the element separation structure; a DRAM circuit formed on the semiconductor substrate in the memory cell area, wherein the DRAM circuit includes a plurality of memory cells and bit Lines, each memory cell has a pair of MISFET and capacitor, one electrode of the capacitor is connected to one region of source/drain regions of a corresponding MISFET, the bit line interconnects the other regions of source/drain regions of MISFET's of some memory cells, the bit Line extends near to a boarder line between the memory cell area and the logic circuit area, and the bit line is disposed-on a layer higher than the interconnect wiring and connected thereto; an interlayer insulating film covering the DRAM circuit and the logic circuit area; a contact hole formed through the interlayer insulating film, a bottom of the contact hole being a partial upper surface of the interconnect wiring; and an upper wiring disposed on the interlayer insulating film, the upper wiring being connected via the contact hole to the interconnect wiring and extending in the logic circuit area.

Although the boarder of the opposing electrode is generally flush with the boarder line between the logic circuit area and memory cell area, the interconnect wiring connected to the bit line extends to the logic circuit area. By connecting the wiring in the logic circuit area to the interconnect wiring, the wiring in the logic circuit area can be connected to the bit line.

As above, in DRAM mixed with logic circuits, the impurity concentrations of gate electrodes of MISFET's in the memory cell area and logic circuit area are set to proper values so that both the data storage characteristics of DRAM and the electrical characteristics of logic circuits can be improved.

The lower electrode of a capacitor in the logic circuit area and the gate electrode of MISFET in the logic circuit area are formed at the same time, and the upper electrode and the word line in the memory cell area are formed at the same time. It is therefore possible to suppress an increase in the number of manufacture processes.

The opposing electrode in the memory cell area is isotropically etched to retract the boarder of the opposing electrode from the boarder line between the memory cell area and logic circuit area. It is therefore unnecessary to use a photomask for defining the boarder of the opposing electrode.

The wiring in the logic circuit area is connected to the bit line in the memory cell area via the interconnect wiring disposed on the element separation structure formed on a boarder area between the logic circuit area and memory cell area. By making the interconnect wiring extend away from the boarder of the opposing electrode in the memory cell area toward the logic circuit area, it becomes easy to connect the wiring in the logic circuit area to the interconnect wiring.

DESCRIPTION OF THE DRAWINGS

FIGS. 1A to 1I are cross sectional views of a substrate illustrating a method of manufacturing a semiconductor device according to a first embodiment of the invention.

FIGS. 6A and 6B are cross sectional views of a substrate illustrating a method of manufacturing a semiconductor device according to a fifth embodiment of the invention.

DETAILED DESCRIPTION OF THE PREFERRED EMBODIMENTS

Figure 1A:
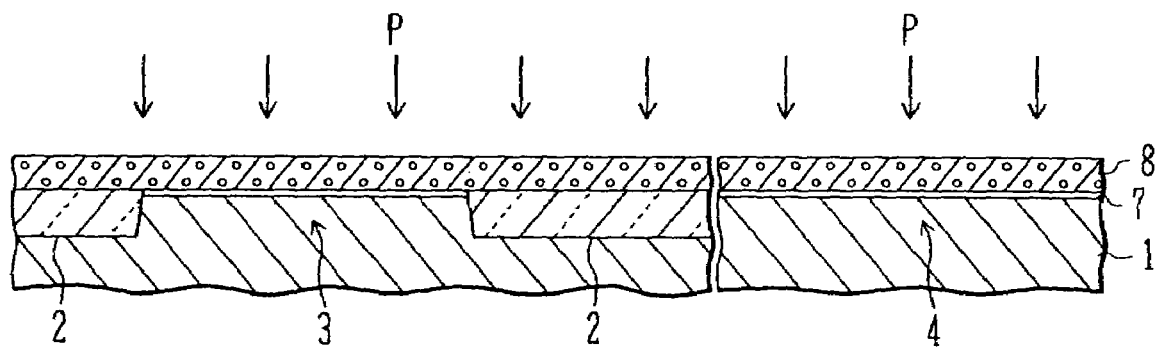
Figure 1B:
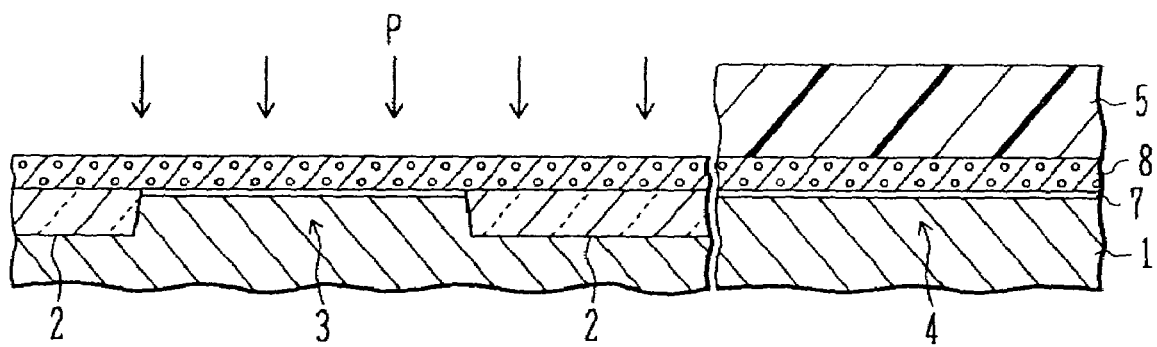
Figure 1C:
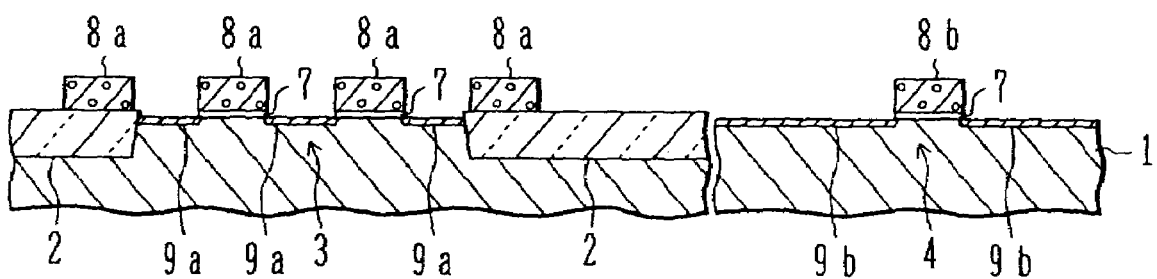
Figure 1D:
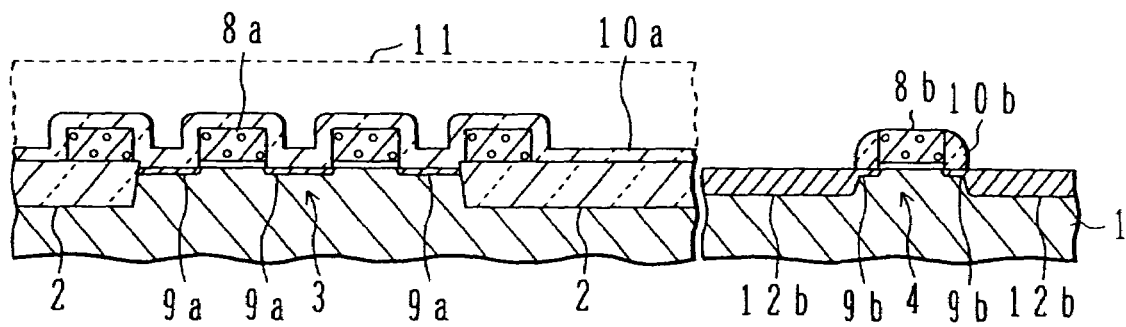
Figure 1E:
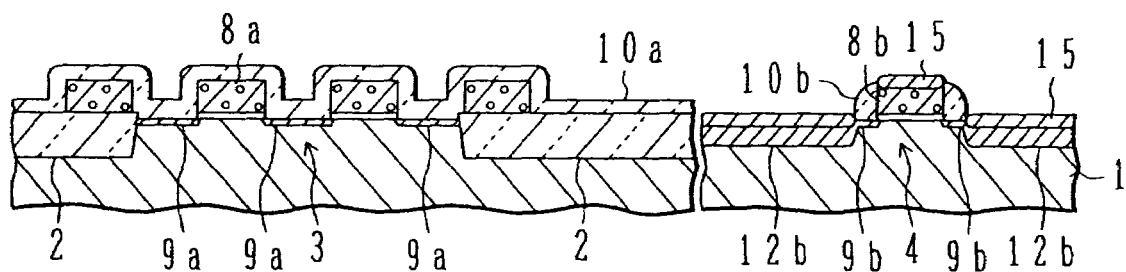
Figure 1F:
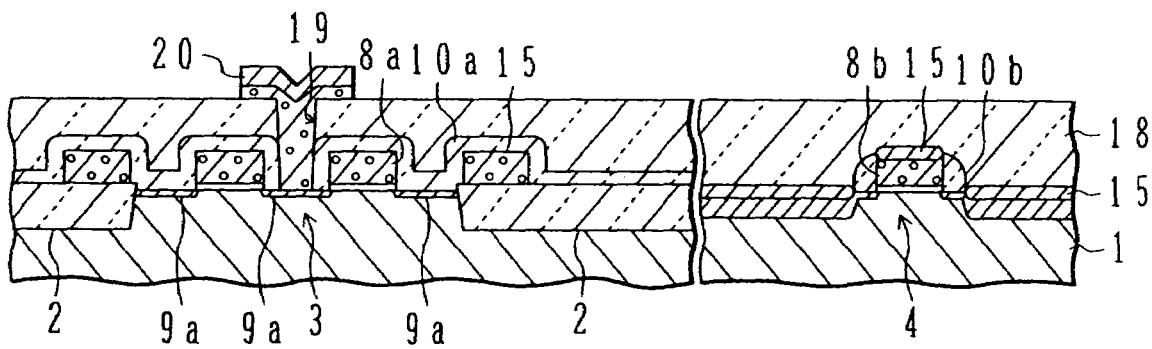
Figure 1G:
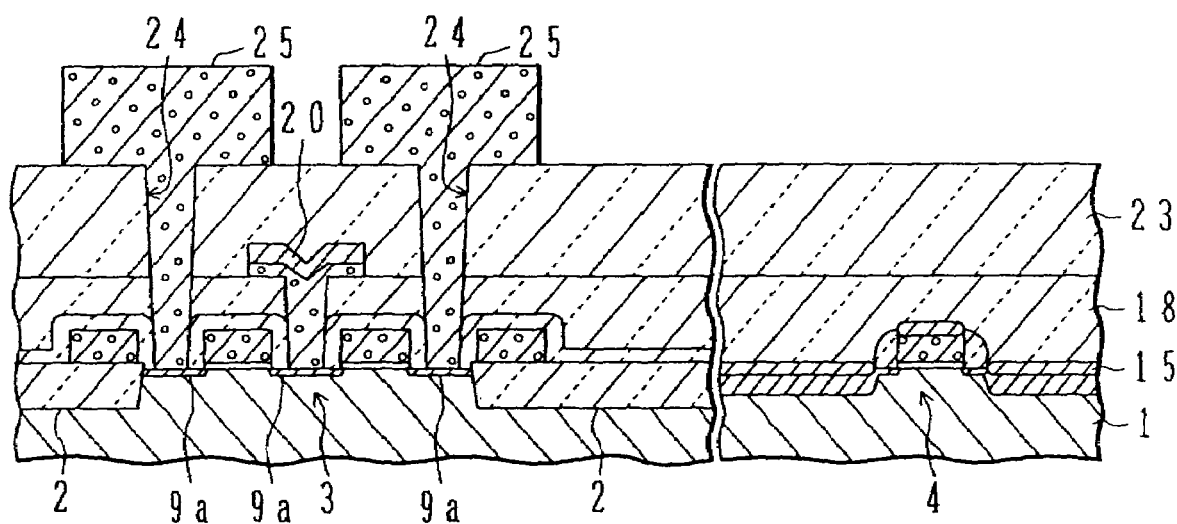
Figure 1I:
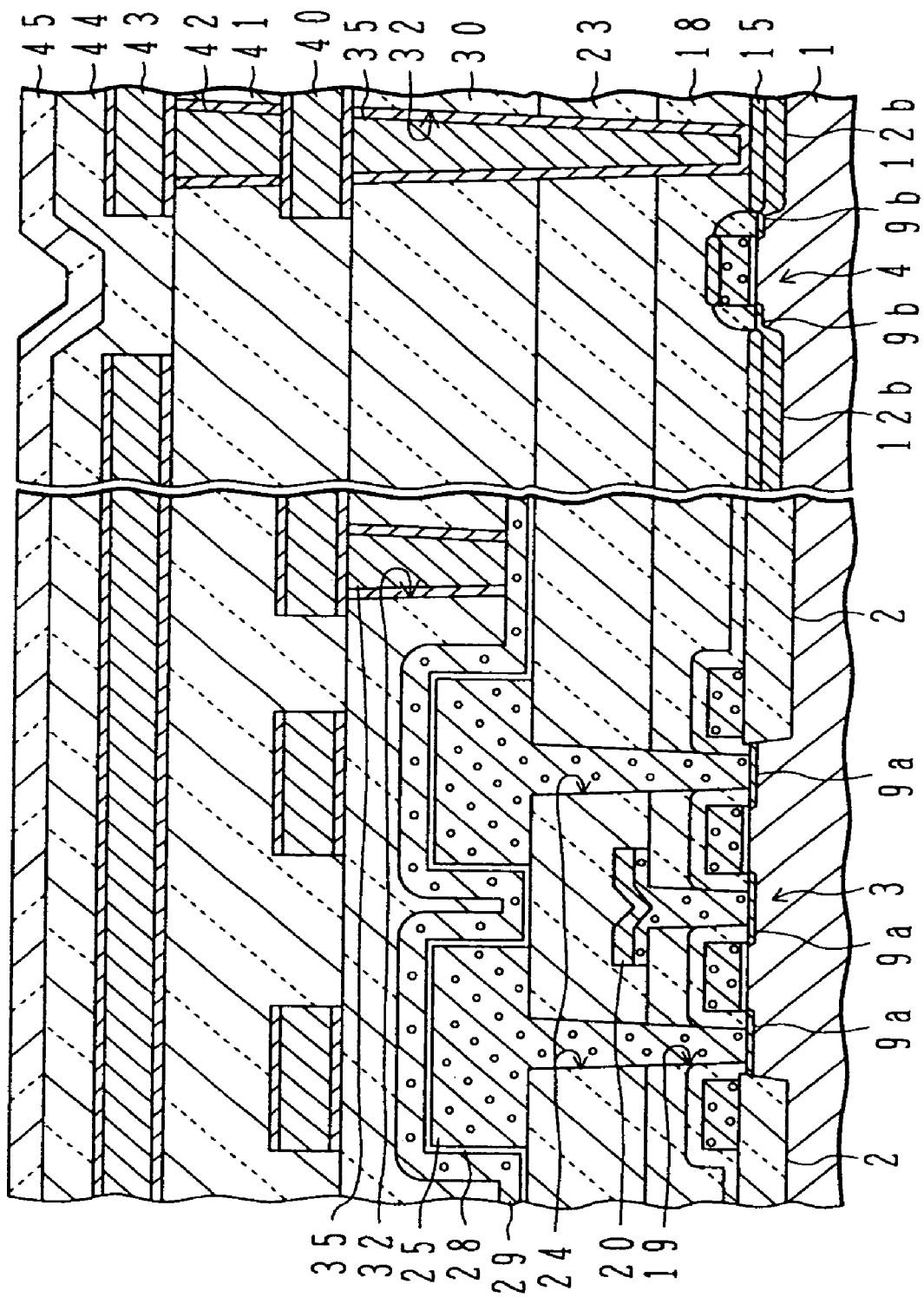

With reference to FIGS. 1A to 1I and FIGS. 2A and 2B, the first embodiment of the invention will be described. FIGS. 1A and 1I are cross sectional views of a substrate illustrating a method of manufacturing a semiconductor device according to the fifth embodiment. In each drawing, the left side of a cut portion shows a memory cell area, and the right side shows an n-channel MISFET forming area in the logic circuit area.

Processes up to the process illustrated in FIG. 1A will be described first. On the surface of a p-type silicon substrate 1, element separation structures 2 of a shallow trench type are formed by a well-known method. The element separation structures 2 define an active region 3 in the memory cell array area and an active region 4 in the logic circuit area. On the surfaces of the active regions 3 and 4, gate oxide films 7 of $SiO_2$ are formed to a thickness of 5 to 10 nm through thermal oxidation. A polysilicon film 8 is deposited to a thickness of 100 to 250 nm, covering the gate oxide film 7. For example, the polysilicon film 8 is deposited through chemical vapor deposition (CVD) using $SiH_4$.

The polysilicon film 8 is subject to a first phosphorous (P) ion implantation under the conditions of an acceleration energy of 10 to 30 keV and a dose of 3 to $6 \times 10^{15}$ $cm^{-2}$. In this case, the p-channel MISFET forming area (not shown) in the logic circuit area is covered with a resist pattern.

As shown in FIG. 1B, the surface of the polysilicon film 8 in the logic circuit area is covered with a resist pattern 5. The polysilicon film 8 in the memory cell area is subject to a second P ion implantation under the conditions of an acceleration energy of 10 to 30 keV and a dose of 5 to $8 \times 10^{15}$ $cm^{-2}$. After this ion implantation, the resist pattern 5 is removed.

As shown in FIG. 1C, the polysilicon film 8 is patterned to leave a plurality of word lines 8a in the memory cell area and gate electrodes 8b in the logic circuit. For example, the polysilicon film 8 is etched through reactive ion etching (RIE) using a mixture gas of $Cl_2$ and $O_2$. The word line 8a extends vertically relative to the surface of the drawing sheet. Two word lines 8a traverse on one active region 3. The word lines 8a are also formed on the element separation structures 2 on both sides of the active region 3. The word lines 8a on the active region 3 also serve as the gate electrodes of MISFET's to be formed in the active region 3.

By using the word lines 8a and gate electrode 8b as a mask, impurity ions are implanted. P ions are implanted in the MISFET forming area in the memory cell area under the conditions of an acceleration energy of 10 to 30 keV and a dose of 1 to $5 \times 10^{13}$ $cm^{-2}$. P ions are implanted in the n-channel MISFET forming area in the logic circuit area under the conditions of an acceleration energy of 5 to 30 keV and a dose of 1 to $5 \times 10^{13}$ $cm^{-2}$, and then As ions are doped in the same area under the conditions of an acceleration energy of 5 to 30 keV and a dose of 1 to $50 \times 10^{13}$ $cm^{-2}$. With these ion implantation processes, source/drain regions 9a of MISFET's are formed in the memory cell area, and low concentration regions 9b of the source/drain regions of a lightly doped drain (LDD) structure are formed in the logic circuit area.

A high performance MISFET can be formed in the logic circuit area by doping As in the low concentration region 9b of MISFET. The source/drain regions 9a of MISFET in the memory cell area are doped with only P without doping As, so that DRAM having a reduced leak current and good refresh characteristics can be formed.

Processes up to the process illustrated in FIG. 1D will be described. An $SiO_2$ film is deposited to a thickness of 80 to 120 nm over the substrate whole surface. For example, the SiO$_2$ film is deposited through CVD using SiH$_4$ and O$_2$. The memory cell area is covered with a resist pattern 11 to anisotropically etch the SiO$_2$ in the logic circuit area. Side wall insulating films 10$b$ are therefore left on the side walls of the gate electrode in the logic circuit area, and an SiO$_2$ film 10$a$ is left in the memory cell area.

Next, ion implantation processes are performed to form source/drain regions in the logic circuit area. As ions are implanted in the n-channel MISFET forming area under the conditions of an acceleration energy of 30 to 40 keV and a dose of 2 to $4\times10^{15}$ cm$^{-2}$, and boron (B) ions are implanted in the p-channel MISFET forming area under the conditions of an acceleration energy of 5 to 15 keV and a dose of 2 to $4\times10^{15}$ cm$^{-2}$. During both the ion implantation processes, the memory cell area is covered with the resist pattern. With these ion implantation processes, high concentration regions 12$b$ of source/drain regions of the LDD structure are formed. After these ion implantation processes, a natural oxide film on the silicon surface is removed by using hydrofluoric acid.

As shown in FIG. 1E, cobalt silicide (CoSi$_2$) films 15 are formed on the surfaces of the gate electrode 8$b$ and high concentration regions 12$b$. A method of forming the CoSi$_2$ film will be described in the following. First, a Co film is deposited through sputtering or the like, covering the whole surface of the substrate. A first thermal annealing is performed at a substrate temperature of 450 to 500° C., and thereafter a second thermal annealing is performed at a substrate temperature of 800 to 900° C. A silicide reaction is therefore performed between the silicon surface and CO film to thereby form the CoSi$_2$ film 15. The Co film without the silicide reaction is removed by using hydrofluoric acid. In this manner, the CoSi$_2$ film 15 can be formed in a self-alignment manner only on the silicon exposed surface.

Since the surfaces of the source/drain regions 9$a$ and word lines 8$a$ in the memory cell area are covered with the SiO$_2$ film 10$a$, the silicide reaction will not occur in these areas. Since the high concentration regions 12$b$ of the source/drain regions in the logic circuit area are in contact with the Co film, the silicide reaction occurs at the interface therebetween. Other metals different from Co may be used which form a metal silicide through a silicide reaction with Si, such as Ti.

As shown in FIG. 1F, a borophosphosilicate glass (BPSG) film 18 is deposited to a thickness of 800 to 1200 nm, covering the whole surface of the substrate. For example, the BPSG film 18 is deposited through CVD using a mixture gas of SiH$_4$, B$_2$H$_6$, O$_2$, and PH$_3$ as source gases. A thermal annealing is performed at a substrate temperature of 700 to 850° C., and thereafter the surface of the BPSG film is planarized through chemical mechanical polishing (CMP).

A contact hole 19 is formed exposing the surface of the source/drain region 9$a$ at the center of the active region 3, by etching the BPSG film 18 through RIE using a mixture gas of CF$_4$ and CHF$_3$. A bit line 20 is formed which is connected to the central source/drain region 9$a$ via the contact hole 19. The bit line 20 extends along a direction perpendicular to the word line in the area other than the cross sectional view of FIG. 1F.

A method of forming the bit line 20 will be described in the following. A 50 nm thick polysilicon film doped with P and a 100 nm thick tungsten silicide (WSi) film are deposited covering the whole surface of the substrate. The polysilicon film is deposited through CVD using SiH$_6$ as source gas, and the WSi film is deposited through CVD using WF$_6$ and SiH$_4$ as source gases. Prior to deposition of the polysilicon film, a natural oxide film formed on the bottom of the contact hole 19 may be removed by using hydrofluoric acid.

The polysilicon film and WSi film are patterned to form the bit line 20. The polysilicon film and WSi film are etched through RIE using Cl$_2$ and O$_2$.

As shown in FIG. 1G, a BPSG film 23 is deposited to a thickness of 800 to 1200 nm, covering the whole surface of the substrate. A thermal annealing is performed at a substrate temperature of 700 to 850° C., and thereafter the surface of the BPSG film 23 is planarized through CMP.

Contact holes 24 are formed exposing the surfaces of the source/drain regions 9$a$ on both sides the central source/drain region 9$a$ in the active region 3. Storage electrodes 25 are formed which is connected to the source/drain regions 9$a$ via the corresponding contact holes 24. The storage electrode 25 is formed by depositing a polysilicon film doped with P to a thickness of 300 to 800 nm and thereafter patterning this film.

As shown in FIG. 1H, a silicon nitride (SiN) film is deposited to a thickness of 3 to 5 nm, covering the whole surface of the substrate. This SiN film is thermally oxidized at a temperature of 700 to 800° C. to form a capacitor dielectric film 28 made of SiON. An opposing electrode 29 made of polysilicon doped with P and having a thickness of 100 nm is formed covering the capacitor dielectric film 28. The dielectric film 28 and opposing electrode 29 in an area different from the memory cell array area are removed. This two-layer etching is performed through RIE using Cl$_2$ and O$_2$.

As shown in FIG. 1I, a BPSG film 30 is deposited to a thickness of 1000 to 1500 nm, covering the whole surface of the substrate. Contact holes 32 are formed exposing a partial surface area of the opposing electrode 29 and a partial surface area of the CoSi$_2$ film 15 in the logic circuit area. Although not shown in FIG. 1I, a contact hole exposing a partial surface area of the bit line 20 is formed at the same time.

The inside of the contact hole 32 is embedded with a W plug 35. A method of forming the W plug 35 will be described in the following. First, a barrier metal layer is deposited by sputtering. For example, the barrier layer has a two-layer structure of a Ti film and a TiN film. A W film is deposited through CVD to a thickness of 300 to 500 nm on the barrier metal layer to fill the inside of the contact hole 32 with W. Unnecessary W film and barrier metal layer are removed by CMP to leave only the W plug 35 in the contact hole 32.

A wiring pattern 40 is formed on the BPSG film 30. The wiring pattern has a lamination structure constituted of a barrier metal layer, an aluminum (Al) film, and an antireflection film. For example, the antireflection film is made of TiN.

An SiO$_2$ film 41 is deposited on the BPSG film 30, covering the wiring pattern 40. For example, the SiO$_2$ film 41 is deposited through CVD using high density plasma. A contact hole is formed in the SiO$_2$ film 41 and the inside of the contact hole is embedded with a W plug 42. A wiring pattern 43 is formed on the surface of the SiO$_2$ film 41, and an SiO$_2$ film 44 is deposited covering the wiring pattern 43.

A cover film 45 is deposited covering the SiO$_2$ film. The cover film 45 has a two-layer structure constituted of an SiO$_2$ film and an SiN film both formed through plasma CVD.

In the first embodiment described above, the first ion implantation illustrated in FIG. 1A and the second ion implantation illustrated in FIG. 1B are performed for the gate electrode of MISFET in the memory cell area, i.e., word line 8$a$. Only the first ion implantation illustrated in FIG. 1A is performed for the gate electrode 8$b$ of n-channel MISFET in the logic circuit area.

The gate electrodes and word lines are used as a mask in the ion implantation process for the source/drain regions described with reference to FIGS. 1C and 1D. In this case, impurities are additionally implanted into the word lines 8$a$ and gate electrodes 8$b$. By taking into consideration this additional ion dose, the doses of the first and second ion implantation processes are properly selected so that the impurity concentrations in the gate electrodes of MISFET's in the memory cell area and logic circuit area can be within adequate ranges.

In the first embodiment described above, the first ion implantation illustrated in FIG. 1A is performed for both of the memory cell area and the logic circuit area. At the step of the second ion implantation illustrated in FIG. 1B, ion implantation may be performed at a dose of 8 to $15\times10^{16}$ cm$^{-2}$ without the first ion implantation. In this case, ion implantation for the gate electrode $8b$ is performed at a same time when ion implantation for a source/drain region of MISFET in the logic circuit area.

Figure 2A:
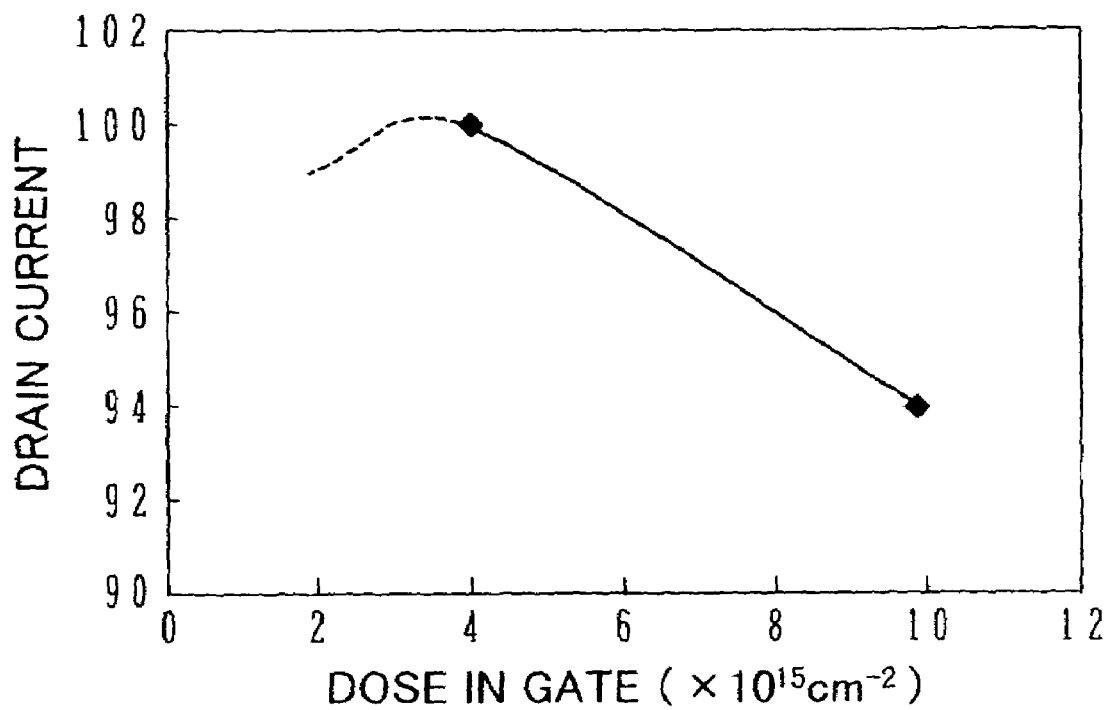
FIG. 2A is a graph showing a relation between an impurity dose in a gate electrode and a drain current of MISFET.

FIG. 2A is a graph showing a relation between an impurity dose in a gate electrode and a drain current when a voltage 2.5 V is applied to the gate electrode. The abscissa represents an impurity dose in the gate electrode in the unit of "$\times10^{15}$ cm$^{-2}$", and the ordinate represents a drain current represented by a value relative to 100 which is the largest drain current among samples used. The thickness of the gate electrode was set to 180 nm, implanted impurities were P, and the acceleration energy of ion implantation was set to 20 keV. The impurity dose in the channel region was adjusted so that the threshold voltage became 0.45 V.

A largest drain current is obtained at about the impurity dose of $4\times10^{15}$ cm$^{-2}$. At the impurity does larger than this, the drain current reduces. This is because it is necessary to raise the impurity concentration of the channel region as the impurity concentration of the gate electrode increases, in order to prevent the threshold value from being lowered. If the impurity concentration of the gate electrode is too low, the gate electrode is depleted and the characteristics of MISFET are degraded. It is therefore preferable to set the impurity concentration of the gate electrode to about $4\times10^{15}$ cm$^{-2}$.

Figure 2B:
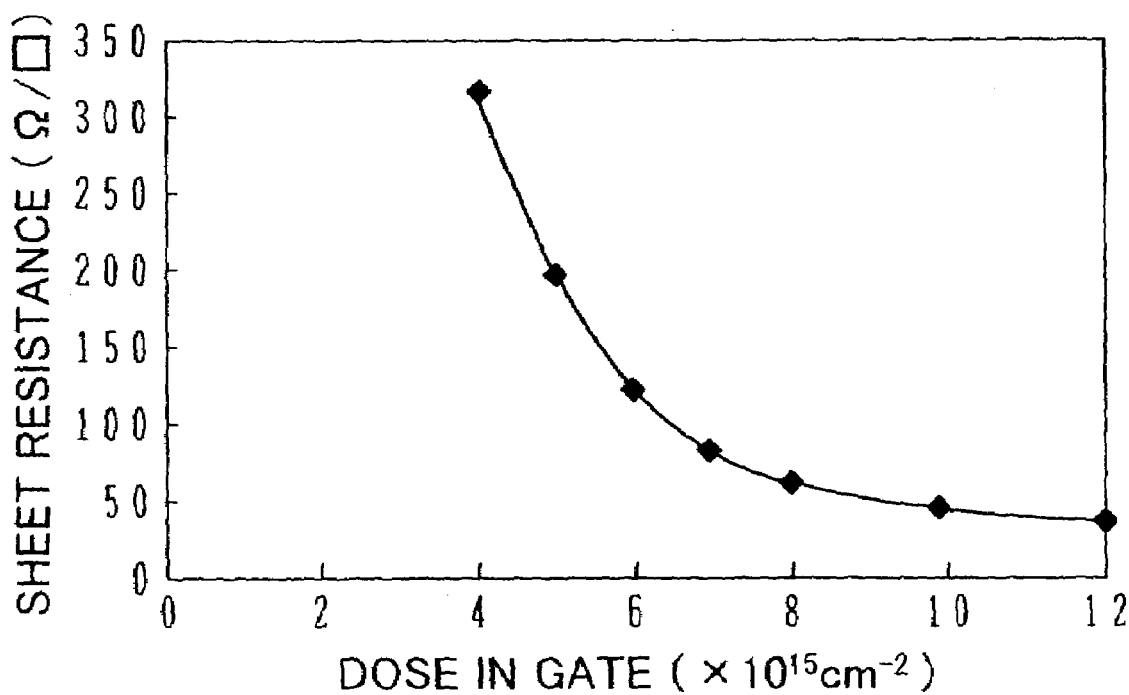
FIG. 2B is a graph showing a relation between an impurity dose in a gate electrode and a sheet resistance.

FIG. 2B is a graph showing a relation between an impurity dose in the gate electrode and a sheet resistance of the gate electrode. The abscissa represents an impurity dose in the gate electrode in the unit of "$\times10^{15}$ cm$^{-2}$", and the ordinate represents a sheet resistance in the unit of "$\Omega/\square$". The gate electrode thickness, implanted impurities, and acceleration energy were the same as those used for the graph of FIG. 2A. A sheet resistance of a word line of DRAM is generally 80 $\Omega/\square$ or lower. In order to satisfy this requirement, the impurity dose in the gate electrode is set to about $1\times10^{16}$ cm$^{-2}$.

It can be understood from the comparison between FIGS. 2A and 2B that the impurity dose necessary for the gate electrode in the logic circuit area is different from that necessary for the gate electrode in the memory cell area. By performing the first ion implantation for the entire polysilicon film 8 and the second ion implantation only for the polysilicon film 8 in the memory cell area, as in the first embodiment, proper impurities can be implanted for the gate electrodes both in the logic circuit area and memory cell area.

Also in the first embodiment, the memory cell area is covered with the $SiO_2$ film $10a$ during the silicide reaction process illustrated in FIG. 1E. It is therefore possible to prevent a metal silicide from being formed on the surfaces of the source/drain regions in the memory cell area. The good data storage characteristics can therefore be realized.

Next, with reference to FIGS. 3A to 3F, the second embodiment will be described. In the second embodiment, capacitors are formed in the logic circuit area. In each drawing, the right side of a cut portion shows a memory cell area, and the left side shows a logic circuit area.

Figure 3A:
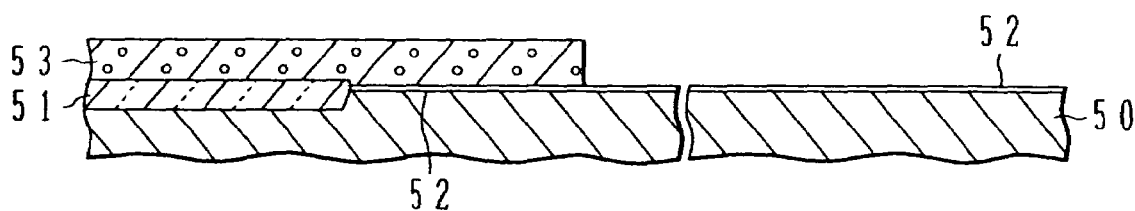
FIGS. 3A to 3F are cross sectional views of a substrate illustrating a method of manufacturing a semiconductor device according to a second embodiment of the invention.

Processes up to the process illustrated in FIG. 3A will be described first. On the surface of a p-type silicon substrate 50, element separation structures 51 are formed to define active regions 3 in the memory cell array area and logic circuit area. On the surfaces of the active regions, gate oxide films 52 are formed to a thickness of 5 to 10 nm through thermal oxidation. A first conductive film 53 made of polysilicon is deposited to a thickness of 100 to 250 nm over the whole surface of the substrate. The first conductive film 53 may be made of amorphous silicon instead of polysilicon.

P ions are implanted into the first conductive film 53 in an n-channel MISFET forming area and a capacitor forming area in the logic circuit area, for example, under the conditions of an acceleration energy of 20 keV and a dose of 3 to $6\times10^{15}$ cm$^{-2}$. P and As may be implanted at a total dose of 3 to $6\times10^{15}$ cm$^{-2}$. Boron (B) ions are implanted into the first conductive film 53 in a p-channel MISFET forming area in the logic circuit area. Impurities are not necessarily required to be implanted into the first conductive film 53 in the p-channel MISFET forming area. The gate electrode of p-channel MISFET is implanted with p-type impurities at the same time when ions are implanted for forming source/drain regions. After the above ion implantation processes, annealing is performed for activating implanted ions.

After this annealing for activation, the first conductive film 53 in the memory cell area is removed through RIE using a mixture gas of $Cl_2$ and $O_2$. After the first conductive film 53 is patterned, the gate oxide film 52 left on the surface of the memory cell area and a natural oxide film formed on the surface of the first conductive film 53 are removed by using hydrofluoric acid.

Figure 3B:
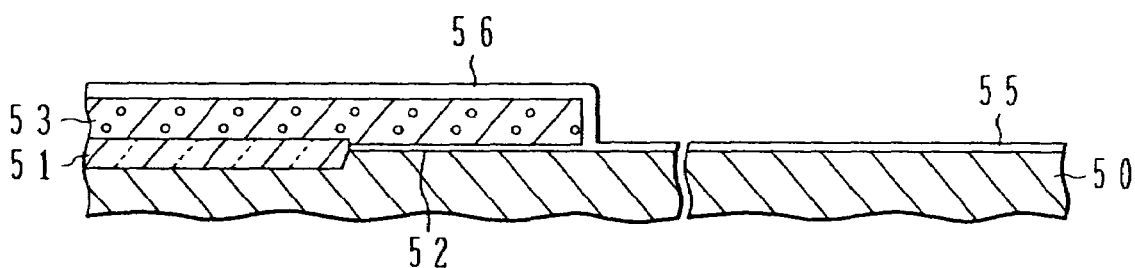

As shown in FIG. 3B, the surface of the active region in the memory cell area is thermally oxidized to form a second gate oxide film 55 having a thickness of 5 to 10 nm. In this case, the surface of the first conductive layer 53 is also oxidized so that a capacitor dielectric film 56 having a thickness of 10 to 30 nm can be formed at the same time.

Figure 3C:
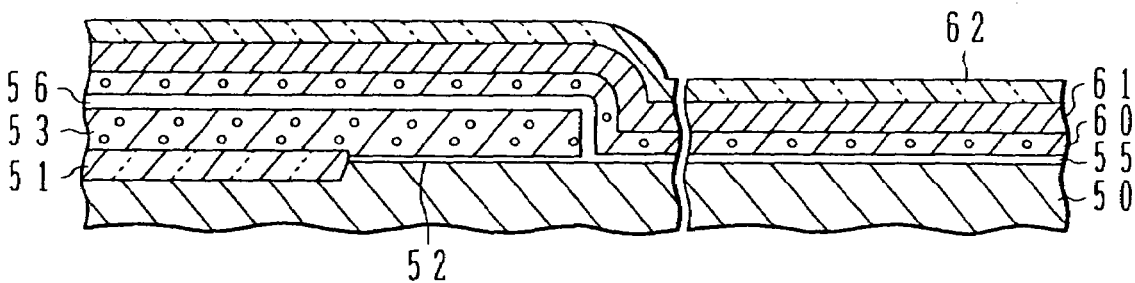

As shown in FIG. 3C, a polysilicon film 60, a tungsten silicide (WSi) film 61, and a first SiN film 62 are formed through CVD in this order over the whole surface of the substrate. The polysilicon film 60 is 50 to 100 nm in thickness and doped with P to impart an n-type conductivity. The WSi film 61 and first SiN film 62 have both a thickness of 100 to 200 nm.

Figure 3D:
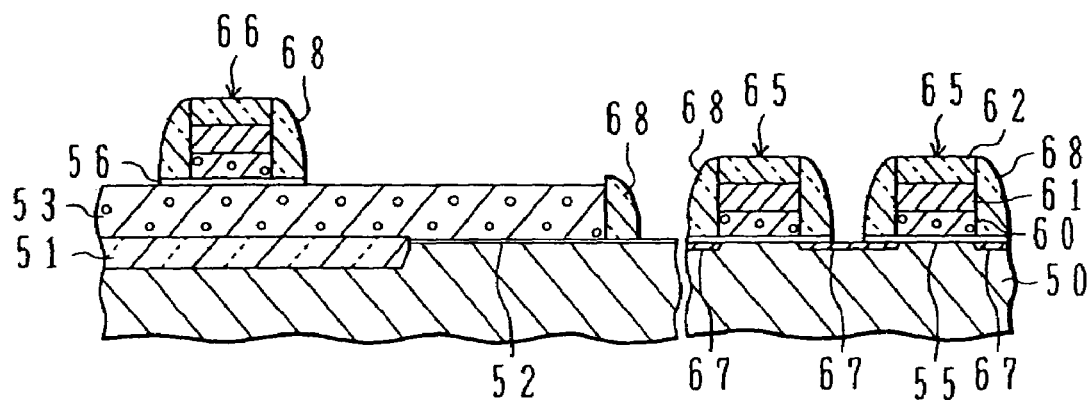

As shown in FIG. 3D, three layers from the first SiN film 62 to the polysilicon layer 60 are patterned to leave word lines 65 in the memory cell area and a capacitor upper electrode 66 in the capacitor forming area in the logic circuit area. The word line 65 and capacitor upper electrode 66 have both a three-layer structure constituted of the polysilicon film 60, WSi film 61, and first SiN film 62. The first SiN film 62 is etched through RIE using a mixture gas of $CH_4$, $CHF_3$, and Ar, the WSi film 61 is etched through RIE using a mixture gas of $Cl_2$ and $O_2$, and the polysilicon film 60 is etched through RIE using a mixture gas of $Cl_2$ and $O_2$.

By using the word lines 65 as a mask, P ions are implanted in the memory cell area under the conditions of an acceleration energy of 10 to 30 keV and a dose of 2 to $5\times10^{13}$ cm$^{-2}$. Source/drain regions 67 are therefore formed on both side of the word line 65 in the memory cell area.

Side wall insulating films 68 made of SiN are formed on the side walls of the word line 65 and capacitor upper electrode 66. The side wall insulating film 68 is formed by depositing an SiN film over the whole surface of the substrate and anisotropically etching this film. This anisotropic etching is performed through RIE using a mixture gas of $CF_4$, $CHF_3$, and Ar. In this case, the capacitor dielectric film 56 on the first conductive film 53 in the area where the upper capacitor electrode 66 is not formed, is also removed and the upper surface of the first conductive film 53 is exposed.

Figure 3E:
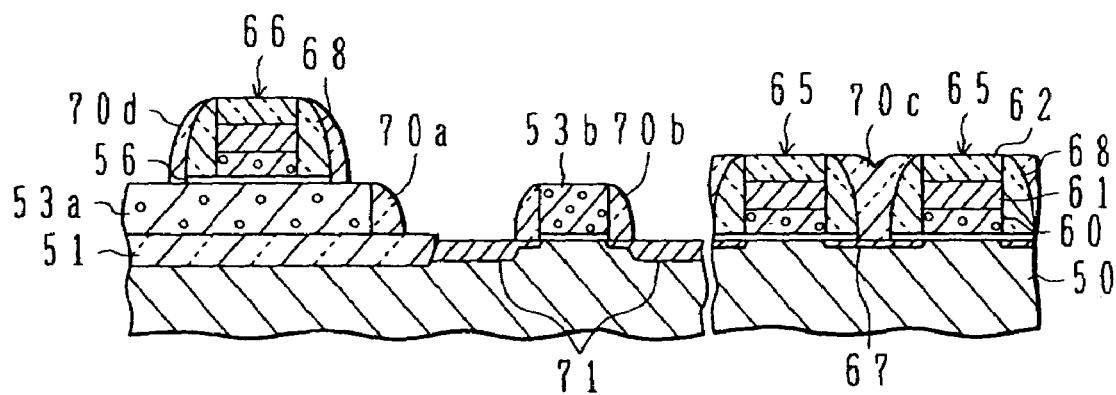

As shown in FIG. 3E, the first conductive film 53 is patterned to leave a lower capacitor electrode 53a in an area inclusive of the upper capacitor electrode 66 as viewed along a direction normal to the substrate surface and to leave a gate electrode 53b in the n-channel MISFET forming area in the logic circuit area. Although not shown in FIG. 3E, the gate electrode is also left in the p-channel MISFET forming area. The first conductive film 53 is etched through RIE using a mixture gas of $Cl_2$ and $O_2$. In some case, the side wall insulating film 68 on the side wall of the first conductive film 53 is left without being removed. In such a case, when the first conductive film 53 is etched, the boarder area of the first conductive film 53 is covered with a mask pattern to positively leave the first conductive film 53 under the mask pattern.

By using the gate electrode 53b as a mask As ions are implanted in the n-channel MISFET forming area in the logic circuit area for forming low concentration regions of an LDD structure. The ion implantation conditions are an acceleration energy of 5 to 15 keV and a dose of 1 to $10 \times 10^{13}$ cm$^{-2}$. Similarly, B ions are implanted in the p-channel MISFET forming area under the ion implantation conditions of an acceleration energy of 5 to 15 keV and a dose of 1 to $10 \times 10^{13}$ cm$^{-2}$.

An $SiO_2$ film is deposited over the whole surface of the substrate and anisotropically etched to leave side wall insulating films 70b on the side walls of the gate electrode 53a. At this time, side wall insulating films 70a are left on the side walls of the lower capacitor electrode 53a, and side wall insulating films 70d are left on the slanted surfaces of the side wall insulating films 68. In the memory cell area, spaces between word lines 65 are embedded with embedding insulating members 70c.

By using the gate electrode 53b and side wall insulating films 70b as a mask, As ions are implanted in the n-channel MISFET forming area in the logic circuit area for forming high concentration regions of the LDD structure. The ion implantation conditions are an acceleration energy of 30 to 40 keV and a dose of 2 to $4 \times 10^{15}$ cm$^{-2}$. Similarly, B ions are implanted in the p-channel MISFET forming area (not shown) under the ion implantation conditions of an acceleration energy of 5 to 15 keV and a dose of 2 to $4 \times 10^{15}$ cm$^{-2}$. After the ion implantations, annealing for activation is performed to thus form source/drain regions 71 of the LDD structure.

Figure 3F:
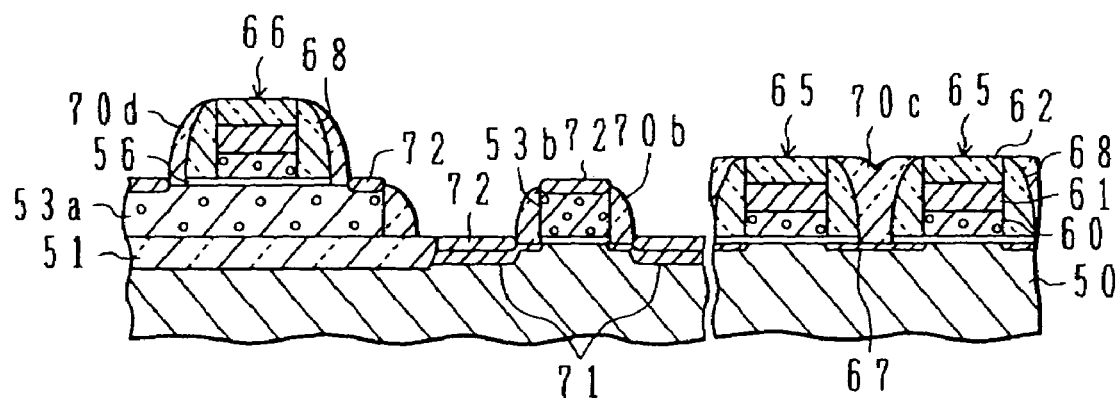

As shown in FIG. 3F, $CoSi_2$ films 72 are formed on the upper surfaces of the source/drain regions 71 and gate electrode 53b of MISFET in the logic circuit area. The $CoSi_2$ film 72 is formed by a process similar to the process of forming the $CoSi_2$ film 15 of the first embodiment described with reference to FIG. 1E. During this process, since the surfaces of the source/drain regions 67 in the memory cell area are covered with the embedding insulating members 70c, the $CoSi_2$ film is not formed on the surfaces of the source/drain regions 67.

By performing processes similar to those of the first embodiment shown in FIG. 1F and following figures, DRAM mixed with logic circuits and containing a capacitor is formed, the capacitor being constituted of the lower capacitor electrode 53a, capacitor dielectric film 56, and upper capacitor electrode 66.

Similar to the first embodiment, also in the second embodiment, a metal silicide film can be formed only in the logic circuit area without forming it in the logic circuit area. In the second embodiment, the upper capacitor electrode 66 is formed by the same process as that for the word lines 65 in the memory cell area, and the lower capacitor electrode 53a is formed by the same process as that for the gate electrode 53b in the logic circuit area. Therefore, a capacitor having a lamination structure of a polysilicon film/an $SiO_2$ film/a polysilicon film can be formed by suppressing an increase in the number of manufacture processes as much as possible.

Further, as shown in FIG. 3F, the top and side surfaces of the word line 65 are covered with the side wall insulating films 68 made of SiN and first SiN film 62. These side wall insulating films 68 and first SiN film 62 function as the protective films for the WSi film 61 and polysilicon film 60 if the contact hole 19 shown in FIG. 1F and the contact hole 24 shown in FIG. 1G are formed under the conditions that SiN is not substantially etched. It is therefore possible to form the contact holes 19 and 24 in a self-alignment manner.

Still further, since the side wall insulating films 70b on the side walls of the gate electrode 53b in the logic circuit area are made of $SiO_2$, it is possible to enhance a hot carrier resistance of MISFET and reduce parasitic capacitance more than the case where the side wall insulating films are made of SiN. Since the side wall insulating films 70b are formed by a process different from the process of forming the side wall insulating films 68 in the memory cell area, it is possible to set the thickness of the side wall insulating film 70b to a value most suitable for suppressing the short channel effects.

Next, with reference to FIGS. 4A to 4F, the third embodiment will be described. In each drawing, the right side of a cut portion shows a memory cell area, and the left side shows a logic circuit area.

Figure 4A:
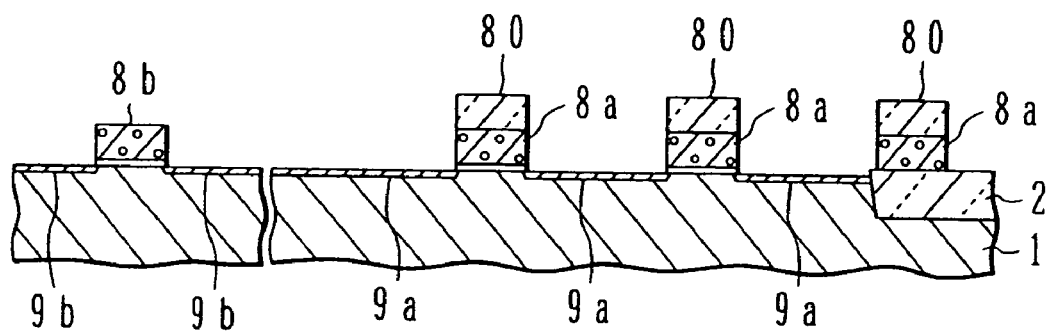
FIGS. 4A to 4F are cross sectional views of a substrate illustrating a method of manufacturing a semiconductor device according to a third embodiment of the invention.

FIG. 4A corresponds to FIG. 1C of the first embodiment. A different point from the first embodiment is that an upper $SiO_2$ film 80 of about 100 nm thickness is formed on the word line 8a. Processes up to the process illustrated in FIG. 4A will be described by paying attention to processes different from those up to FIG. 1C.

On the substrate formed with element separation structures 2, a polysilicon film and an $SiO_2$ film are deposited, and the $SiO_2$ film in the logic circuit is removed. Similar to the first embodiment, the polysilicon film contains implanted ions. After the $SiO_2$ film in the logic circuit area is removed, the processes similar to the first embodiment are performed to form the substrate shown in FIG. 4A.

In the third embodiment, after ions implanted for forming low density regions 9b of MISFET in the logic circuit area, ions are implanted for forming source/drain regions 9a in the memory cell area.

Processes similar to those up to the process of forming the $CoSi_2$ film 15 of the first embodiment shown in FIG. 1E are performed.

Figure 4B:
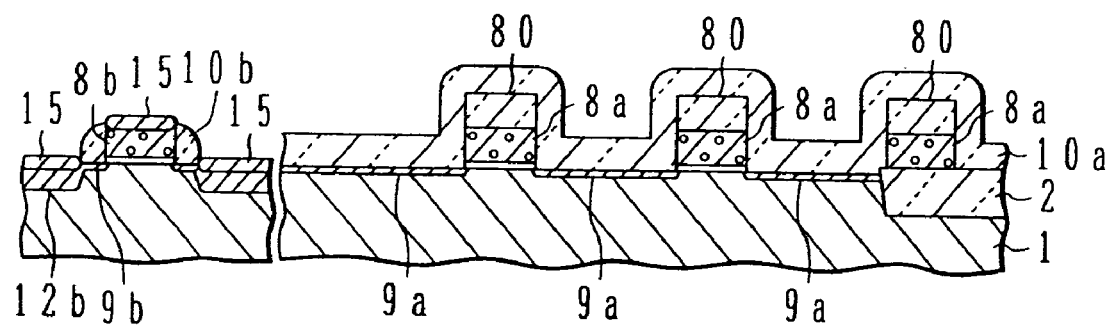
Figure 4C:
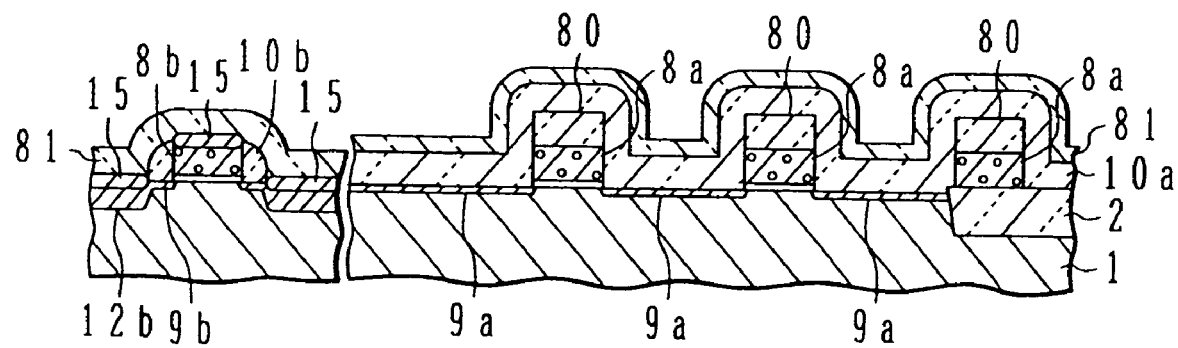

As shown in FIG. 4B, $CoSi_2$ films 15 are therefore formed on the upper surface of the gate electrode 8b in the logic circuit area and on the upper surfaces of high concentration regions 12b of the source/drain regions. The memory cell area is being covered with an $SiO_2$ film which has a thickness of 50 to 120 nm.

As shown in FIG. 1C, a low temperature $SiO_2$ film 81 is deposited to a thickness of 20 to 50 nm over the whole surface of the substrate. The low temperature $SiO_2$ film 81 is deposited through CVD at a growth temperature of 700° C. or lower. For example, the $SiO_2$ film 81 is deposited through plasma CVD at a substrate temperature of about 400° C. Deposition at a low temperature can prevent the $CoSi_2$ film 15 from being deteriorated by heat.

Figure 4D:
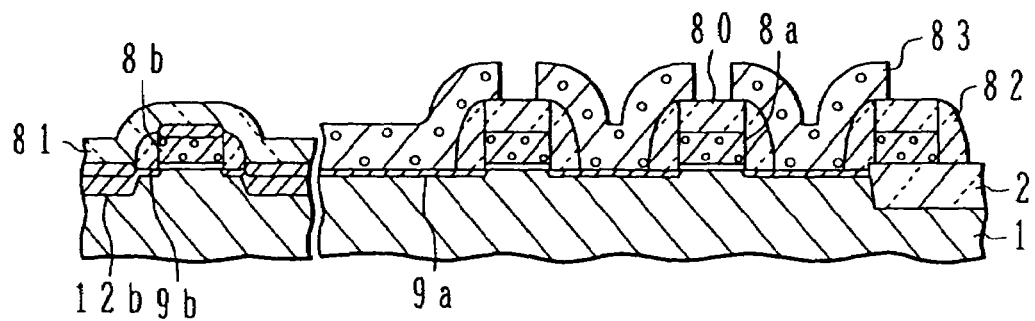

As shown in FIG. 4D, the $SiO_2$ film 10a and low temperature $SiO_2$ film 81 are anisotropically etched to leave side wall insulating films 82 on the side walls of the lamination structures in the memory cell area each constituted of the word line 8a and upper SiO$_2$ film 80. In this case, the logic circuit area is covered with a resist pattern. The low temperature SiO$_2$ film 81 in the logic circuit area is left unetched.

An amorphous silicon film doped with P is deposited through CVD to a thickness of 100 to 200 nm over the whole surface of the substrate. The amorphous silicon film is patterned to leave pads 83 on the source/drain regions 9a in the memory cell area. The pad 83 covers the surface of the source/drain region 9a, the side surfaces of the side wall insulating films 82 on both sides of the source/drain region 9a, and partial top surfaces of the upper SiO$_2$ films 80.

Figure 4E:
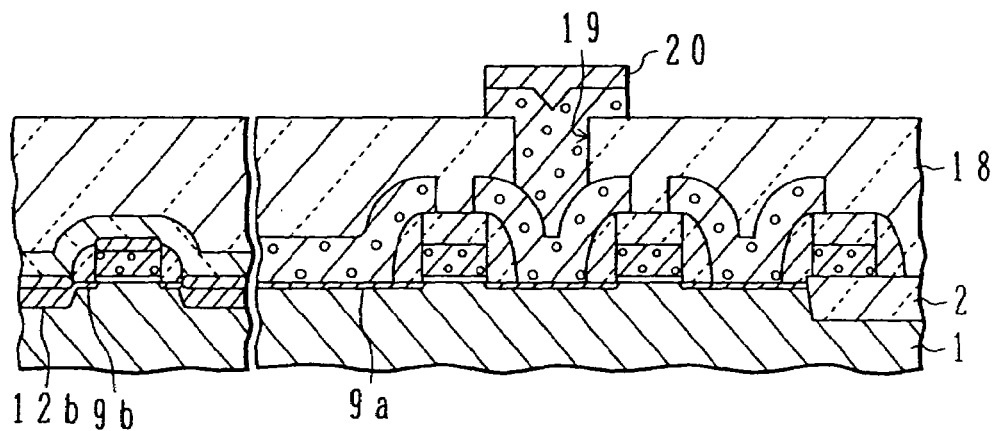

As shown in FIG. 4E, a BPSG film 18 is deposited over the whole surface of the substrate, and a contact hole 19 is formed therein. Thereafter, a bit line 20 is formed which contacts the pad 83. These processes are similar to those of the first embodiment described with FIG. 1F.

Figure 4F:
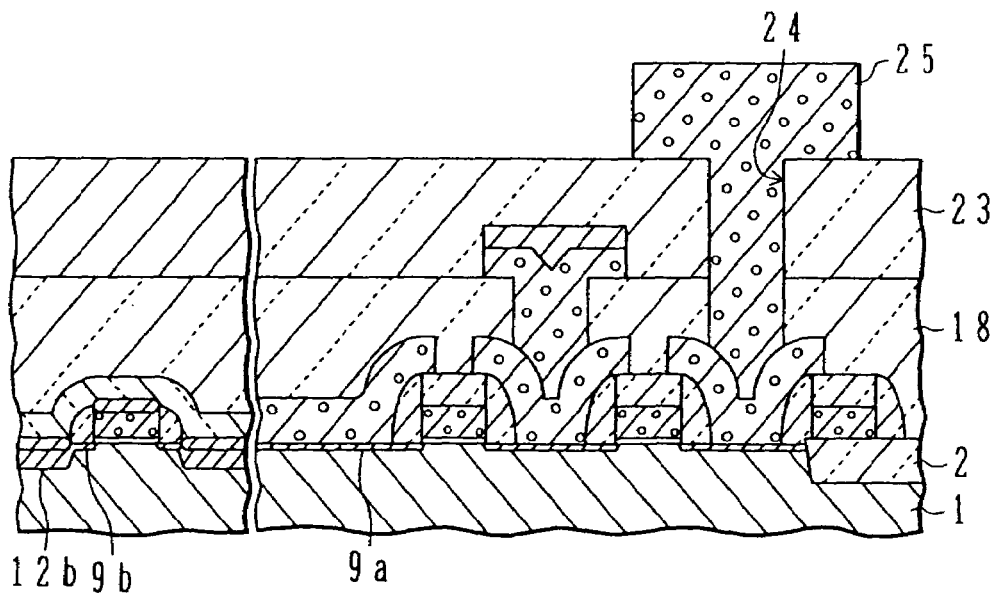

As shown in FIG. 4F, a BPSG film 23 is deposited over the substrate whole surface, a contact hole 24 is formed and thereafter a storage electrode 25 is formed. These processes are similar to those of the first embodiment described with FIG. 1G.

In the third embodiment, when the contact holes 19 and 24 shown in FIGS. 4E and 4F are formed, the pads 83 are exposed at the bottoms of the contact holes. The source/drain regions 9a are not exposed therefore directly to the etching atmosphere, so that any defect in the source/drain regions 9a can be prevented from being formed. It is therefore possible to prevent the data storage characteristics of DRAM from being deteriorated by defects in the source/dram regions 9a.

In the first to third embodiments described above, MISFET's in the memory cell area and logic circuit area are formed generally in parallel. A method of forming DRAM formed with logic circuits is known by which after all constituents up to an opposing electrode (e.g., opposing electrode 29 shown in FIG. 1H) are formed in the memory cell area, source/drain regions of MISFET in the logic circuit area are formed. A problem associated with this method is how a bit line in the memory cell area is electrically connected to a wiring pattern in the logic circuit area. Fourth and fifth embodiments to be described hereinafter feature in this connection structure.

Figure 5A:
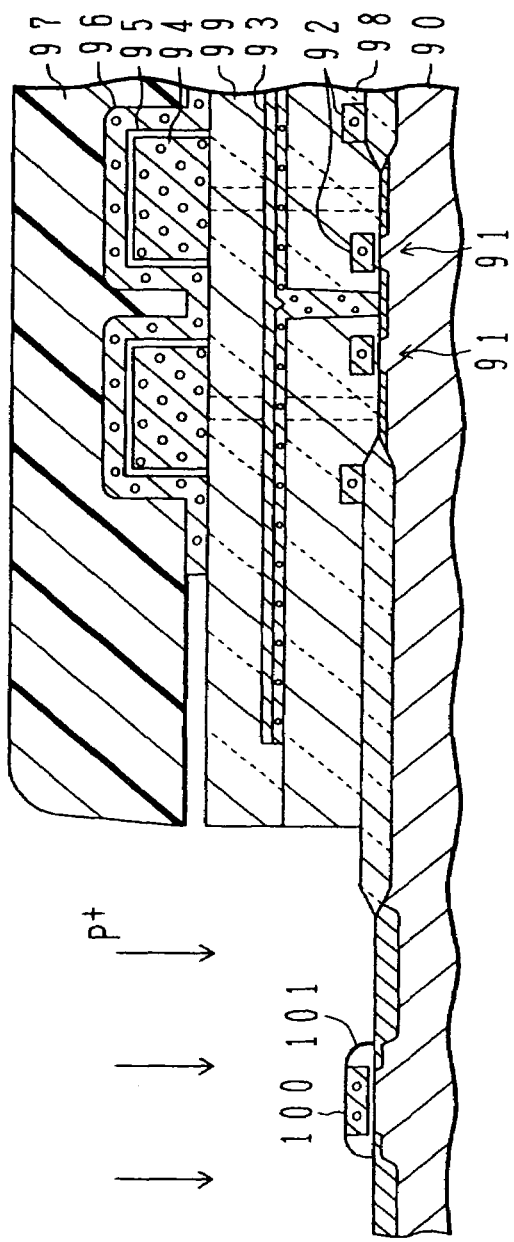
FIGS. 5A and 5B are cross sectional views of a substrate illustrating a method of manufacturing a semiconductor device according to a fourth embodiment of the invention.
Figure 5B:
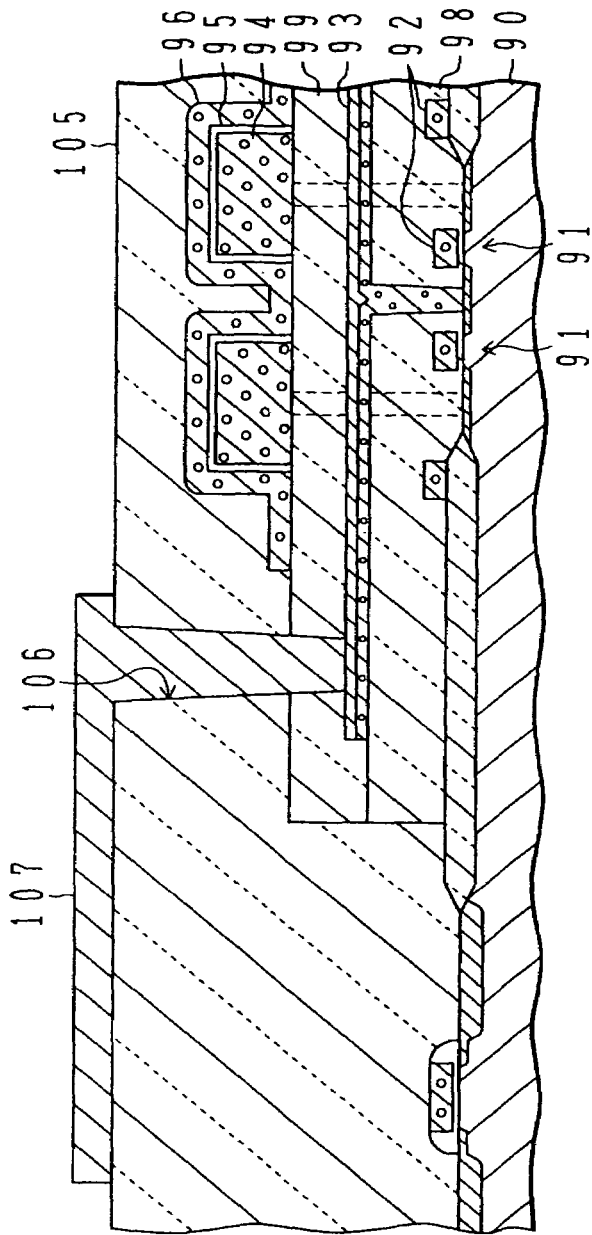

With reference to FIGS. 5A and 5B, the fourth embodiment will be described. FIGS. 5A and 5B are cross sectional views of the boundary areas between the memory cell area and logic circuit area.

As shown in FIG. 5A, formed in the memory cell area (approximately a right half area of FIG. 5A) of a silicon substrate 90 are MISFET's 91, word lines 92, an interlayer insulating film 98, a bit line 93, an interlayer insulating film 99, storage electrodes 94, capacitor dielectric films 95, and an opposing electrode 96. This configuration can be formed by processes similar to those shown in FIGS. 1A to 1H. However, in the logic circuit area, only gate electrodes are formed, and the ion implantation for high concentration regions 12b of source/drain regions shown in FIG. 1D and the formation of the CoSi$_2$ 15 shown in FIG. 1E are not performed. In the logic circuit area, a gate electrode 100 and side wall insulating films 101 on the side walls of the gate electrode 100 are formed. The interlayer insulating films 98 and 00 and opposing electrode 96 are also formed in the logic circuit area.

A resist pattern 97 is formed covering the surface of the opposing electrode 96 in the memory cell area The boarder of the resist pattern protrudes toward the logic circuit area by about 0.2 µm from the front end of the bit line 93. By using the resist pattern 97 as a mask, the opposing electrode 96 deposited in the logic circuit is removed. The opposing electrode 96 is removed thorough isotropic etching using chlorine containing gas.

The opposing electrode 96 is also side-etched and the boarder thereof retracts from the boarder of the resist pattern 97. The depth of side-etch is set to about 1 to 1.5 µm. Namely, the border of the opposing electrode 96 retracts from the front end of the bit line 93 by about 0:8 to 1.3 µm.

After the opposing electrode 96 is removed, the interlayer insulating films 99 and 98 in the logic circuit area are removed by using the resist pattern 97 as a mask. The interlayer insulating films 99 and 98 are removed through anisotropic RIE. In order to stop anisotropic RIE etching with good reproductivity, the surfaces of the gate electrode 100, side wall insulating films 101, and silicon substrate 90 may be covered with a thin SiN film. If this thin SiN film is used, it is removed after the interlayer insulating films 99 and 98 are removed.

P ions are implanted in the logic circuit area by using as a mask the gate electrode 100 and side wall insulating films 101. The ion implantation conditions are the same as those used for forming the high concentration regions 12b of the first embodiment shown in FIG. 1D. After this ion implantation, the resist pattern 97 is removed.

As shown in FIG. 5B, an interlayer insulating film 105 of BPSG is deposited over the substrate whole surface, and the surface thereof is planarized through CMP. A contact hole 106 is formed thorough the interlayer insulating films 105 and 99 to expose the partial top surface of the bit line 93. The contact hole 106 is formed at the position away from the boarder of the opposing electrode 96 toward the logic circuit area. Since the boarder of the opposing electrode 96 retracts by about 0.8 to 1.3 µm from the front end of the bit line 93, the contact hole 106 can be formed without being in contact with the opposing electrode 93. In the logic circuit area, a wiring pattern 107 is formed on the interlayer insulating film 105. This wiring pattern 107 is connected via the contact hole 106 to the bit line 93.

In the fourth embodiment, the boarder of the opposing electrode 96 is defined by side-etch, and a dedicated photomask for defining the boarder of the opposing electrode 96 is not used. Namely, the boarder of the opposing electrode 96 can be defined by using only the resist pattern which defines the boarder line between the memory cell area and logic circuit area.

Next, with reference to FIGS. 6A and 6B, the fifth embodiment will be described. As shown in FIG. 6A, the memory cell area of a silicon substrate 90 has a DRAM circuit formed therein. The structure of the DRAM circuit is the same as that of the fourth embodiment shown in FIG. 5A.

An element separation structure 110 defines a boarder between the memory cell area and logic circuit area. On the surface of the element separation structure 110, an interconnect wiring pattern 111 is formed in correspondence with each bit line 93. The interconnect wiring pattern 111 is formed by the same processes as those used for a word line 92. Each bit line 93 is connected to the interconnect wiring pattern 110 via a contact hole formed through an interlayer insulating film 98 at the position near the front end of the bit line 93.

The surface of an opposing electrode 96 in the memory cell area is covered with a resist pattern 97. By using this resist pattern 97 as a mask, the opposing electrode 96 and interlayer insulating film 99 in the logic circuit area are removed. A partial surface area of the interconnect wiring pattern 111 is exposed in the logic circuit area. The surfaces of the gate electrode 100, side wall insulating films 101, and interconnect wiring pattern 111 may be covered with an SiN film which is used as an etching stopper layer. Similar to the processes of the fourth embodiment shown in FIG. 5A, P ions are implanted in the logic circuit area.

As shown in FIG. 6B, an interlayer insulating film 105 of BPSG is deposited over the substrate whole surface, and the surface thereof is planarized through CMP. A contact hole 106 is formed thorough the interlayer insulating film 105 to expose the partial top surface of the interconnect wiring pattern 111. The contact hole 106 is formed at the position away from the boarder of the opposing electrode 96 toward the logic circuit area. Since the interconnect wiring pattern 111 extends to the logic circuit area, the contact hole 106 can be formed without being in contact with the opposing electrode 93.

In the logic circuit area, a wiring pattern 107 is formed on the interlayer insulating film 105. This wiring pattern 107 is connected via the contact hole 106 to the bit line 93.

In the fifth embodiment, the bit line 93 is connected to the wiring pattern 107 via the interconnect wiring pattern 111. Therefore, similar to the fourth embodiment, the bit line 93 and wiring pattern 107 can be connected with good reproductivity by using only the resist pattern 97 which defines the boarder between the logic circuit area and memory cell area.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising, in the recited order, the steps of:
   preparing a semiconductor substrate having a memory cell area and a logic circuit area defined on a principal surface of the semiconductor substrate;
   forming an element separation structure made of insulating material in a partial area of the principal surface of the semiconductor substrate to define active regions;
   forming first gate insulating films in areas of the principal surface of the semiconductor substrate where the element separation structure is not formed;
   forming a first conductive film covering the element separation structure and the first gate insulating films;
   removing the first conductive film in the memory cell area;
   forming a capacitor dielectric film on a surface of the first conductive film;
   forming a second conductive film on the capacitor dielectric film and on the semiconductor substrate;
   patterning the second conductive film to leave an upper electrode over the element separation structure and to leave a plurality of word lines serving as gate electrodes in the memory cell area;
   patterning the capacitor dielectric film and the first conductive film to leave a lower electrode made of the first conductive film, in which the lower electrode is left in a pattern inclusive of the upper electrode as viewed along a direction normal to the semiconductor substrate, a gate electrode made of the first conductive film is left over the active region in the logic circuit area, and the capacitor dielectric film is left between the upper and lower electrodes;
   depositing an insulating film over the whole surface of the semiconductor substrate;
   etching the insulating film to leave side wall insulating films on side walls of the gate electrodes in the logic circuit area and leave an embedding insulating member embedding spaces between the word lines;
   implanting impurities into a substrate surface layer on both sides of the gate electrode in the logic circuit area using the side wall insulating films and the gate electrodes in the logic circuit area as a mask;
   forming a metal silicide film on an upper surface of the gate electrode in the logic circuit area and on a surface of the semiconductor substrate on both side of the gate electrode.

2. A method of manufacturing a semiconductor device comprising, in the recited order, the steps of:
   preparing a semiconductor substrate having a memory cell area and a logic circuit area defined on a principal surface of the semiconductor substrate;
   forming an element separation structure made of insulating material in a partial area of the principal surface of the semiconductor substrate to define active regions;
   forming first gate insulating films in areas of the principal surface of the semiconductor substrate where the element separation structure is not formed;
   forming a first conductive film covering the element separation structure and the first gate insulating films;
   removing the first conductive film in the memory cell area;
   forming a capacitor dielectric film on a surface of the first conductive film;
   forming a second conductive film on the capacitor dielectric film and on the semiconductor substrate;
   patterning the second conductive film to leave an upper electrode over the element separation structure and to leave a plurality of word lines serving as gate electrodes in the memory cell area;
   patterning the capacitor dielectric film and the first conductive film to leave a lower electrode made of the first conductive film, in which the lower electrode is left in a pattern inclusive of the upper electrode as viewed along a direction normal to the semiconductor substrate, a gate electrode made of the first conductive film is left over the active region in the logic circuit area, and the capacitor dielectric film is left between the upper and lower electrodes;
   depositing an insulating film over the whole surface of the semiconductor substrate;
a step of etching the insulating film to leave side wall insulating films on side walls of the gate electrodes in the logic circuit area and leave an embedding insulating members embedding spaces between the word lines;
   depositing an upper insulating film on the second conductive film after said step of forming the second conductive film, the upper insulating film made of insulating material having an etching resistance different from the embedding insulating member, wherein in said step of patterning the second conductive film, the upper insulating film is patterned to have a same pattern as the second conductive film; and
   forming a second side wall insulating film on a side wall of each word line after said step of leaving the word lines, the second side wall insulating film being made of insulating material having an etching resistance different from the embedding insulating member, wherein the embedding insulating member is filled in between the second side wall insulating films disposed on opposing side walls of adjacent word lines.

* * * * *